United States Patent [19]

Furuta et al.

[11] Patent Number: 4,863,829

[45] Date of Patent: Sep. 5, 1989

[54] POSITIVE TYPE HIGH GAMMA-VALUE PHOTORESIST COMPOSITION WITH NOVOLAK RESIN POSSESSING

[75] Inventors: Akihiro Furuta; Makoto Hanabata, both of Osaka; Seimei Yasui, Hyogo; Osamu Hiroaki; Naoyoshi Jinno, both of Osaka, all of Japan

[73] Assignee: Sumitomo Chemical Company, Limited, Osaka, Japan

[21] Appl. No.: 175,658

[22] Filed: Mar. 29, 1988

Related U.S. Application Data

[63] Continuation of Ser. No. 823,827, Jan. 29, 1986, abandoned, which is a continuation-in-part of Ser. No. 586,539, Mar. 5, 1984, abandoned.

[30] Foreign Application Priority Data

Mar. 4, 1983 [JP] Japan ............................... 58-036318
Jan. 31, 1984 [JP] Japan ............................... 59-16258

[51] Int. Cl.$^4$ ............................................... G03C 1/60
[52] U.S. Cl. ............................... 430/192; 430/165; 430/191; 430/193; 430/326
[58] Field of Search .................. 430/192, 326, 191

[56] References Cited

U.S. PATENT DOCUMENTS

| | | | |
|---|---|---|---|
| 3,634,082 | 1/1972 | Christenson | 430/192 |
| 3,759,711 | 9/1973 | Rouner et al. | 430/165 |
| 4,022,942 | 5/1977 | Anderson et al. | 427/381 |
| 4,097,463 | 6/1978 | Culbertson | 528/140 |
| 4,297,473 | 10/1981 | Koshibe et al. | 528/144 |
| 4,299,947 | 11/1981 | Nanjo et al. | 528/144 |
| 4,308,368 | 12/1981 | Kubo et al. | 430/192 |
| 4,347,305 | 8/1982 | Shiba et al. | 430/192 |
| 4,377,631 | 3/1983 | Toukhy et al. | 430/192 |
| 4,529,682 | 7/1985 | Toukhy | 430/190 |

FOREIGN PATENT DOCUMENTS 1227602 4/1971 United Kingdom ............... 430/192

OTHER PUBLICATIONS

Kosar, J., *Light-Sensitive Systems*, J. Wiley & Sons, 1965, pp. 336–339, 342 and 352.
Bowder, J. et al., *J. Electrochem. Soc.*, vol. 128, No. 6, pp. 1304, 1305, 1981.
Pampalone, T. R., Solid State Technology, 6/1984, pp. 115–120.
DeForest, W. S., *Photoresist Matis and Processes*, McGraw-Hill Book Co., 1975, pp. 55, 56, 134, 147–149 & 159–160.

*Primary Examiner*—Charles L. Bowers, Jr.

[57] ABSTRACT

A positive type photoresist composition comprising a novolak resin and O-quinone diazide compound, the novolak resin being one which is obtained by the addition condensation reaction of a phenol and formaldehyde which is performed in one stage by using as a catalyst an organic acid salt of a divalent metal which is more electropositive than hydrogen, or in two stages by using an acid catalyst in the subsequent stage, the phenol being at least one compound represented by the formula

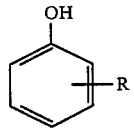

wherein R is hydrogen or an alkyl group of carbon number 1 to 4, the compound being such that the average carbon number in the substituent per one phenol nucelus is 0.5 to 1.5 and the ones with the substituent at the ortho- or para-position with respect to the hydroxyl group account for less than 50 mol %, is disclosed. The positive type photoresist composition of the invention has an improved resolving power, i.e., γ-value.

22 Claims, 1 Drawing Sheet

POSITIVE TYPE HIGH GAMMA-VALUE PHOTORESIST COMPOSITION WITH NOVOLAK RESIN POSSESSING

This is a continuation of application Ser. No. 823,827 filed 1-29-86, abandoned which is a continuation in part of application Ser. No. 586,539 filed 3-5-84, abandoned.

FIELD OF THE INVENTION

The present invention relates to a positive type photoresist composition which is improved in resolving power, i.e., a $\gamma$-value described later.

BACKGROUND OF THE INVENTION

A photosensitive resin composition containing a compound having a quinodiazido group such as a naphthoquinonediazido group, a benzoquinonediazido group, etc. has found use as a positive type photoresist, because, upon exposure to light having a wavelength of 300 to 500 $\mu$m, the quinonediazido group decomposes to form a carboxyl group whereby the composition goes from alkali-insoluble to alkali-soluble. Such a resin composition is usually combined with a novolak resin which gives a uniform, tough resist film. The positive type photoresist is incomparably superior in resolving power to a negative type photoresist. Because of this high resolving power, the positive type photoresist is used as a protective film for photographic etching which is used for producing copper-clad printed-circuit boards and integrated circuits such as IC and LSI.

With the evolution of the integrated circuit, the degree of integration has reached such a level that patterns as thin as 1 $\mu$m are required. According to the conventional processes for the production of integrated circuits, light exposure has been acomplished by placing a mask in intimate contact with the substrate. It is said that this process cannot make patterns thinner than 2 $\mu$m. Instead of the conventional processes, the reduction projection exposure system has come to draw attention.

According to this new system, the pattern of a master mask (reticle) is projected with reduction by a lens system, whereby exposure is accomplished. This system realizes a resolving power of about 1 $\mu$m. With the improvement of this system, a high-performance photoresist has come to be required. One of the important items of performance is a $\gamma$-value. Assuming that when the exposure energy changes from $E_1$ to $E_2$, the rate of development in the exposed area changes from $R_1$ and $R_2$ (provided that the exposure energies $E_1$ and $E_2$ and the rates of developments $R_1$ and $R_2$ are taken within the range where a logarithm of the rate of development is in proportion to a logarithm of the exposure energy), the $\gamma$-value will be a value as defined by the following equation:

$$\gamma = (\log R_2 - \log R_1)/(\log E_2 - \log E_1)$$

The $\gamma$-value is an index representing resolving power, and the greater the $\gamma$-value, the greater the rate of development changes in response to the change of the exposure energy. As the result, the pattern becomes sharper.

Hitherto, a few efforts have been made to improve the -value and pattern size reproducibility of positive type photo-resist compositions through the modification of quinonediazide. However, the results were not satisfactory to meet the recent requirements for those performance. Thus the present inventors paid their attention to improving those performances through the modification of novolak resin which has so far been reglected.

Novolak resin has long been known as a general-purpose molding resin, and a large variety of attempts have been made for its improvement. However, molding-grade novolak resin cannot be used as such for positive type photoresists. For example, novolak resin for molding has a weight average molecular weight (Mw) lower than 2000, whereas a novolak resin for photoresist should have a molecular weight in excess of 3000. In addition, their raw materials such as phenol should be selected according to different standards.

The production of molding-grade novolak resin is disclosed to West Germany Pat. No. 1,022,005. According to this patent, novolak resin is produced by using as a catalyst an organic acid salt of a divalent metal having a greater ionization tendency than hydrogen. The novolak resin thus produced contains more ortho-ortho linkages than that produced by using an acid catalyst. Such a novolak resin is called high-ortho novolak resin. It has an advantage of curing faster than an acid-catalyzed resin when molded in combination with an amine hardener. The curing rate is not necessarily an important property for positive type photoresists. Moreover, the above-cited patent neither describes nor suggests anything about positive type photoresists.

With the foregoing in mind, the present inventors carried out a series of researches on the improvement of novolak resin. As the result, it was unexpectedly found that the positive type photoresist is greatly improved in $\gamma$-value and pattern size reproducibility when it is produced from a specific novolak resin and a o-quinonediazide compound, the novolak resin being synthesized from a specially selected phenol by using as a catalyst an organic acid salt of a metal which is more electropositive than hydrogen. The present invention was completed on the basis of this finding.

SUMMARY OF THE INVENTION

Accordingly, it is an object of this invention to provide a positive type photoresist composition which comprises a novolak resin and a o-quinonediazide compound, the novolak resin being one which is obtained by the addition condensation reaction (referred to as one-stage process hereinafter) of a phenol and formaldehyde which is performed by pH 4 to 7 by using as a catalyst an organic acid salt of a divalent metal which is more electropositive than hydrogen, the phenol being at least one compound represented by the formula:

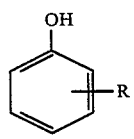

wherein R is hydrogen or an alkyl group of carbon number 1 to 4, the compound being such that the average carbon number in the substituent per one phenol nucleus is 0.5 to 1.5 and the ones with the substituent at the ortho- or para-position with respect to the hydroxyl group account for less than 50 mol %.

It is another object of this invention to provide a positive type photoresist composition which comprises a novolak resin and o-quinonediazide compound, the novolak resin being one which is obtained by the partial addition condensation resaction of a phenol and formaldehyde which is performed at pH 4 to 7 as described above and by the subsequent addition condensation reaction which is performed at pH 4 or below by using an acid catalyst (referred to as two-stage process hereinafter).

BRIEF DESCRIPTION OF THE DRAWINGS

FIGS. 4 to 6 show each the pattern size reproducibility of photoresists prepared in the Examples and Comparative Examples.

DETAILED DESCRIPTION OF THE INVENTION

Figure 3:
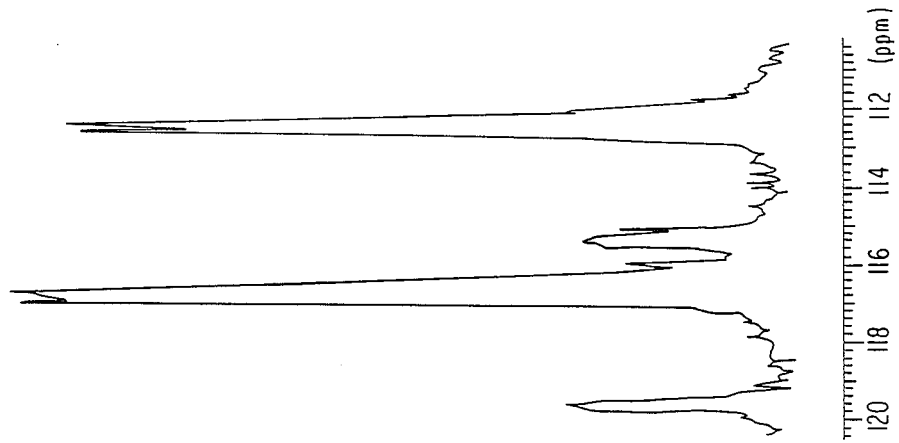
FIGS. 1 to 3 are $^{13}$C-NMR spectra of the novolak resins prepared according to this invention and the conventional process.

The preferred embodiments of this invention are described in the following.

The phenol used as a raw material for the novolak resin is at least one compound represented by the formula:

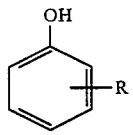

wherein R is hydrogen or an alkyl group of carbon number 1 to 4, and R may be bonded at any of the ortho-, meta-and para-positions with respect to the hydroxyl group.

Examples of the phenol which can be used include phenol, o-cresol, m-cresol, p-cresol, o-ethylphenol, m-ethylphenol, p-ethylphenol, each isomer of propylphenol, and each isomer of butylphenol. They are used individually or in combination with one another under such a condition that the average carbon number in the substituent per one phenol nucleus is 0.5 to 1.5 and the ones with the substituent at the ortho- or para-position with respect to the hydroxyl group account for less than 50 mol %.

With respect to the first condition, if the average carbon number in the substituent per one phenol nucleus is less than 0.5, the resulting novolak resin dissolves excessively fast in a developing solution (alkaline aqueous solution), whereby the film thickness retention in the unexposed area to be retained reduces. Conversely, if the average carbon number in the substituent exceeds 1.5, the resulting novolak resin dissolves excessively slowly in the developing solution, whereby it takes a long time for the development of the exposed area.

With respect to the second condition, if the ones with the substituent at the ortho- or para-position with respect to the hydroxyl group account for more than 50 mol %, the resulting photoresist composition is not improved in the γ-value and pattern size reproducibility as intended.

The above-described two conditions are described in more detail with reference to examples. In the case where a mixture of m-cresol and p-cresol is used, the average carbon number in the substituent per one phenol nucleus is 1, and thus the first condition is satisfied. In order for the second condition to be satisfied, m-cresol and p-cresol can be mixed in a molar ratio of m-cresol/p-cresol≧1. In the case where a mixture of phenol and m-ethyl-phenol is used, the second condition is satisfied because there are no compounds having the substituent at the ortho- or para-position. In order for the first condition to be satisfied, phenol and m-ethyl phenol can be mixed in a molar ratio of $\frac{1}{3}$≦phenol/m-ethylphenol ≦3. In another case where a mixture of phenol and p-ethylphenol is used, the molar ratio for the two compounds is $\frac{1}{3}$≦phenol/p-ethylphenol ≦3 to meet the first condition and phenol/p-ethylphenol ≧1 to meet the second condition, respectively. Thus the two compounds can be used in a molar ratio of 1 ≦phenol/p-ethylphenol ≦3.

Where only one compound is selected as the phenol, only m-cresol can meet both the first and second conditions. In addition to the above described combination, the combination of three or more phenols is possible. In such cases, the mixing ratio can be selected so that the two conditions are satisfied.

A mixture of phenols containing more than 95 mol % of m-cresol is preferable. Such a mixture is similar to single m-cresol, and it permits accurate control over the addition condensation reaction with formaldehyde, which leads to the production of novolak resin of uniform quality.

The formaldehyde which undergoes the addition condensation reaction with phenols can be used in the form of an aqueous solution of formaldehyde (formalin) or paraformaldehyde which is an oligomer of formaldehyde. Particularly, 37% formalin which is commercially available in large quantities is suitably used.

The catalyst used in this invention is an organic acid salt of a divalent metal which is more electropositive than hydrogen. The metal as defined above includes barium, strontium, calcium, magnesium, manganese, zinc, cadmium, cobalt, and lead, which appear in the left side of hydrogen in the ionization series such as shown below.

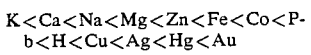

Preferable among these metals are magnesium, manganese, zinc, cadmium, cobalt, and lead. Iron, chromium, nickel, and tin can also be used, but are not so useful because of their poor stability. The above-described divalent metal is used in the form of an organic acid salt. The organic acid salt should be soluble in the reaction mixture and should be one which keeps the reaction mixture in the pH range 4 to 7. Examples of the organic acid salt include acetates, formates, lactates, and benzoates. Preferable among them are acetates.

The divalent metal salt as the catalyst can be used in an amount of 0.1 to 5 wt % based on the phenol. If the quantity if less than 0.1 wt %, the catalytic effect is not sufficient; and if the quantity is in excess of 5 wt %, the catalytic effect does not significantly increase.

The addition condensation reaction of the phenol and formaldehyde in the presence of the divalent metal salt can be carried out in the known way. Proper conditions can be selected according to the reaction system, because the reaction rate varies depending on the kinds of the phenol and catalyst used. The pH of the reaction system is important. The desired novolak is obtained in the pH range 4 to 7. The reaction can be performed in the absence or presence of a solvent.

In the case where the two-stage process is employed, the partial addition condensation reaction of the phenol and formaldehyde, which is carried out in the presence of the divalent metal salt as a catalyst, is followed by the subsequent addition condensation reaction, which is carried out in the presence of an acid catalyst. The acid can be either an inorganic acid or an organic acid. Examples of such acids include hydrochloric acid, sulfuric acid, phosphoric acid, p-toluenesulfonic acid, oxalic acid, and trichloroacetic acid. After the first addition condensation reaction has been carried out for a prescribed period of time in the presence of a divalent metal salt, the second reaction is carried out by adding an acid to the reaction system. By adjusting the proportion between the time of the first reaction and that of the second reaction, it is possible to control the γ-value and pattern size reproducibility of the resulting photoresist composition. If the first reaction is extended, the γ-value and the pattern size reproducibility are improved but the sensitivity tends to decrease. A novolak resin having a balanced γ-value, pattern size reproducibility and sensitivity can be produced by adjusting the proportion in the reaction time.

After the addition of an acid, the reaction system should be adjusted to pH 4 or below. The lower the pH, the higher the reaction rate. The catalyst and pH should be properly selected because the reaction rate varies depending upon the kind of the phenol. The reaction can be performed in the absence or presence of a solvent.

The novolak resin used for the photoresist composition of this invention should have a weight average molecular weight (Mw) of 3000 to 8000 in the case of the one-stage process and 3000 to 20000 in the case of the twostage process, an optimum value of which varies depending upon the kind of phenol, the kind of catalyst, and the reaction condition, however. The molecular weight can be adjusted by changing the molar ratio of formaldehyde to the phenol. The weight average molecular weight was calculated from the GPC chromatogram and the calibration curve of mono-dispersed polystyrene. GPC was carried out by using a preparative liquid chromatography apparatus, Model LC-08 and a column formed by connecting one each of JAIGEL-LS255 and JAIGEL-2H in series, both made by Nippon Bunseki Kogyo Co., Ltd. and tetrahydrofuran (as a carrier solvent) at a flow rate of about 2.5 ml/min.

The novolak resin used for the photoresist composition of this invention differs in structure from that used for conventional positive type photoresists which is synthesized by using an acid catalyst. The difference is described below with reference to m-cresol-formaldehyde novolak resin. The structural difference is distinctly shown by $^{13}$C-NMR spectra. In the spectra shown in FIGS. 1 to 3, the significant difference between the two novolak resins may be noticed by observing the peaks that appear in the range of 110 to 120 ppm.

$N = d/(a+b+c)$ calculated for the novolak resin of this invention is greater than that of the novolak resin used for conventional positive type photoresists which is synthesized by using an acid catalyst, wherein a, b, c, and d represent the respective areas of the peaks at about 112.5 ppm, about 115.5 ppm, about 116.7 ppm, and about 119.6 ppm. There is a tendency that the greater the value N, the higher the γ-value. The $^{13}$C-NMR spectra were obtained under the following conditions. The novolak resin sample was dissolved in deutero dimethyl sulfoxide. A Fourier transform NMR apparatus (22.50 MHz), Model FX-90Q, made by Nippon Electron Optics Laboratory Co., Ltd., was used. Temperature: 25 to 27° C., pulse width: 8.5 μsec (about 35°), waiting period: 2 seconds, reference peak: central peak (39.5 ppm) at the center of the heptaple line of deutero dimethyl sulfoxide, window function: EX-3, apodization function : trapezoidal, $T_1 = T_2 = O$, $T_3 = 3800$, $T_4 = 4095$ (parameter of FX-90Q), data point: double precision accumulation 16K, and number of times of accumulation: more than 20000 times.

The o-quinonediazide compound, which is a photosensitive material in the photoresist composition of this invention, can be obtained by condensing naphthoquinonediazidosulfonyl chloride or benzoquinonediazidosulfonyl chloride with a compound having hydroxyl groups in the presence of a weak alkali. The compound having hydroxyl groups includes, for example, hydroquinone, resorcin, phloroglucin, 2,4-dihydroxybenzophenone, 2,3,4-trihydroxybenzophenone, and alkyl gallates.

The o-quinonediazide compound should be blended with novolak resin in the weight ratio of 1:1 to 1:6.

The photoresist solution can be prepared by dissolving the o-quinonediazide compound and the novolak resin together in a solvent which evaporates at a proper drying rate to give a uniform, smooth film. Examples of the solvent include ethyl cellosolve acetate, methyl cellosolve acetate, ethyl cellosolve, methyl cellosolve, butyl acetate, methyl isobutyl ketone, and xylene.

The positive type photoresist composition of this invention can additionally be incorporated with a small amount of a resin, a plasticizer, a dye, etc. A preferred additional resin is an epoxy resin. The adhesion property of the photoresist composition is improved by the addition of the epoxy resin. As epoxy resin is a low-molecular weight or high-molecular weight compound having two or more epoxy groups in one molecule. The one having a molecular weight of 200 to 20,000 is preferred. It is industrially produced by the reaction of epichlorohydrin and an active hydrogen compound or by the oxidation of olefins. The one produced by the former method includes, for example, a reaction product of bisphenol A and epichlorohydrin, a reaction product of tetrabromobisphenol A and epichlorohydrin, a reaction product of resorcin and epichlorohydrin, a reaction product of phenol-formaldehyde novolak resin and epichlorophydrin, a reaction product of cresol-formaldehyde novolak resin and epichlorohydrin, a reaction product of p-aminophenol and epichlorohydrin, and a reaction product of aniline and epichlorohydrin. The one produced by the latter method includes, for example, epoxidized polybutadiene and epoxidized soybean oil. The epoxy resin can be added in an amount that does not greatly change the photosensitive characteristics of the photoresist composition. The amount varies depending on the type and molecular weight of the epoxy resin used. The epoxy resin is suitably added in an amount of 1 to 20 wt % based on the total weight of the novolak resin and quinonediazide compound.

The invention is described in more detail with reference to the following examples, which should not be construed as limiting the scope of the invention. In the examples, all parts, ratios and percents are by weight, unless otherwise indicated.

REFERENTIAL EXAMPLE 1 (ONE-STAGE PROCESS)

Figure 1:
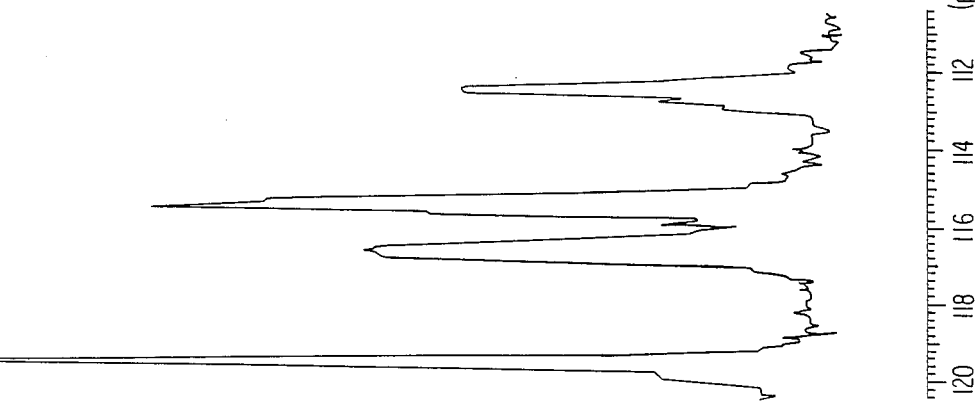

Into a 500-ml separable flask were charged 66.3 g of m-cresol (purity: 99.4%), 42.5 g of formalin (37.0% aqueous solution), and 0.66 g of zinc acetate dihydrate. The pH of the reaction system was about 6. The reactants were heated with stirring in an oil bath at 115° C. for 4 hours. After neutralization, washing with water, and drying under reduced pressure, there was obtained a novolak resin. The weight average molecular weight measured by the GPC chromatograph was 4420. The $^{13}$C-NMR spectrum is shown in FIG. 1. (The value of N is 0.41.)

REFERENTIAL EXAMPLES 2 AND 3 (TWO-STAGE PROCESS)

Figure 2:
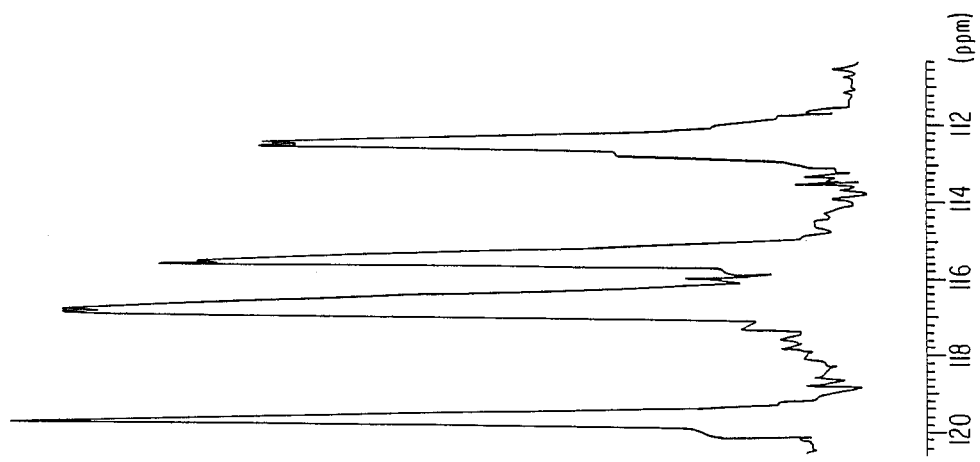

Into a 500-ml separable flask were charged 66.3 g of m-cresol (purity: 99.4%), 47.3 g of formalin (37.0% aqueous solution), and 0.66 g of zinc acetate dihydrate. The pH of the reaction system was about 6. The reactants were heated with stirring in an oil bath at 115° C. for 30 minutes. To the flask were further charged 1.02 g of oxalic acid dihydrate, 6 g of deionized water, and 60 g of ethyl cellosolve acetate. The pH of the reaction system was about 1. The reaction was continued with heating and stirring for 4 hours or 6.5 hours. After neutralization, washing with water, and dehydration, there was obtained a novolak resin in the form of ethyl cellosolve acetate solution. The weight average molecular weight measured by the GPC chromatograph was as follows. The $^{13}$C-NMR spectrum is shown in FIG. 2.

|  | Reaction time (h) | Mw | Value of N |
|---|---|---|---|
| Referential Example 2 | 4 | 4460 | 0.23 |
| Referential Example 3 | 6.5 | 7280 | 0.23 |

REFERENTIAL EXAMPLE 4 (TWO-STAGE PROCESS)

Into a 500-ml separable flask were charged 66.3 g of m-cresol (purity: 99.4%), 0.66 g of zinc acetate dihydrate, and 6.6 g of deionized water. While heating the reactants with stirring in an oil bath at 115° C., 45.0 g of formalin (37.0% aqueous solution) was added dropwise thereto over 40 minutes. The reaction was continued with heating and stirring for 2 hours. Then, 60 g of ethyl cellosolve acetate and 12.5 g a 5% aqueous solution of oxalic acid were charged. The reaction was further continued with heating and stirring in an oil bath at 115° C. for 7 hours. After neutralization, washing with water, and dehydration, there was obtained a novolak resin in the form of ethyl cellosolve acetate solution. The weight average molecular weight measured by the GPC chromatograph was 7430.

REFERENTIAL EXAMPLES 5 TO 7 (TWO-STAGE PROCESS)

Into a 500-ml separable flask were charged 66.3 g of m-cresol (purity: 99.4%), 0.66 g of zinc acetate dihydrate, and 6.6 g of deionized water. While heating the reactants with stirring in an oil bath at 115° C., 47.3 g of formalin (37.0% aqueous solution) was added dropwise thereto over 40 minutes. The reaction was continued with heating and stirring for 40 minutes. Then, 60 g of ethyl cellosolve acetate and 12.5 g of 5% aqueous solution of oxalic acid were successively charged. The reaction was further continued with heating and stirring for a varied period of time as shown below. After neutralization, washing with water, and dehydration, there was obtained a novolak resin in the form of ethyl cellosolve acetate solution. The weight average molecular weight measured by the GPC chromatograph was as follows.

|  | Reaction time (h) | Mw |
|---|---|---|
| Referential Example 5 | 7.5 | 8010 |
| Referential Example 6 | 8 | 10890 |
| Referential Example 7 | 9 | 13200 |

REFERENTIAL EXAMPLE 8

Into a 500-ml separable flask were charged 66.3 g of m-cresol (purity: 99.4%), 47.3 g of formalin (37.0% aqueous solution), 1.02 g of oxalic acid dihydrate, 6 g of deionized water, and 60 g of ethyl cellosolve acetate. The reactants were heated with stirring in an oil bath at 115° C. for 5 hours. After neutralization, washing with water, and dehydration, there was obtained a novolak resin in the form of ethyl cellosolve acetate solution. The weight average molecular weight measured by the GPC chormatograph was 8220. The $^{13}$C-NMR spectrum is shown in FIG. 3. (The value of N is 0.09.)

REFERENTIAL EXAMPLE 9 (TWO-STAGE PROCESS)

Into a 500-ml separable flask were charged 66.3 g of a 6:4 mixture of m-cresol and p-cresol, 45.0 g of formalin (37.0% aqueous solution), and 0.66 g of zinc acetate dihydrate. The reactants were heated with stirring in an oil bath at 115° C. for 0.5 hour. Then, 1.02 g of oxalic acid dihydrate, 6 g of deionized water, and 60 g of ethyl cellosolve acetate were charged. The reaction was further continued with heating and stirring for 3.5 hours. After neutralization, washing with water, and dehydration, there was obtained a novolak resin in the form of ethyl cellosolve acetate solution. The weight average molecular weight measured by the GPC chromatograph was 5010.

REFERENTIAL EXAMPLE 10

Into a 500-ml separable flask were charged 66.3 g of a 6:4 mixture of m-cresol and p-cresol, 45.0 g of formalin (37.0% aqueous solution), 1.02 of oxalic acid dihydrate, 6 g of deionized water, and 60 g of ethyl cellosolve acetate. The reactants were heated with stirring in an oil bath at 115° C. for 3 hours. After neutralization, washing with water, and dehydration, there was obtained a novolak resin in the form of ethyl cellosolve acetate solution. The weight average molecular weight measured by the GPC chromatograph was 5280.

REFERENTIAL EXAMPLE 11 (TWO-STAGE PROCESS)

Into a 500-ml separable flask were charged 28.9 g of phenol, 37.5 g of m-ethylphenol, 45.0 g of formalin (37.0% aqueous solution), and 0.66 g of zinc acetate dihydrate. The reactants were heated with stirring in an oil bath at 115° C. for 0.5 hour. To the flask were further charged 1.02 g of oxalic acid dihydrate, 6 g of deionized water, and 60 g of ethyl cellosolve acetate. The reaction was further continued with heating and stirring for 8 hours. After neutralization, washing with water, and dehydration, there was obtained a novolak resin in the form of ethyl cellosolve acetate solution. The weight average molecular weight measured by the GPC chromatograph was 4830.

REFERENTIAL EXAMPLE 12

Into a 500-ml separable flask were charged 28.9 g of phenol, 37.5 g of m-ethylphenol, 47.5 g of formalin (37.0% aqueous solution), 1.02 g of oxalic acid dihydrate, 6 g of deionized water, and 20 g of ethyl cellosolve acetate. The reactants were heated with stirring in an oil bath at 115° C. for 30 minutes. To the flask was further charged 40 g of ethyl cellosolve acetate. The reaction was further continued with heating and stirring for 3 hours. After neutralization, washing with water, and dehydration, there was obtained a novolak resin in the form of ethyl cellosolve acetate solution. The weight average molecular weight measured by the GPC chromatograph was 5570.

REFERENTIAL EXAMPLES 13 TO 19 (ONE-STAGE PROCESS)

Into a 500-ml separable flask were charged 66.3 g of m-cresol (purity: 99.4%), 42.5 g of formalin (37.0% aqueous solution), and 0.66 g of the following metal salt. The pH of the reaction system was about 4 to 7. The reactants were heated with stirring in an oil bath at 115° C. for 4 hours. After neutralization, washing with water, and drying under reduced pressure, there was obtained a novolak resin.

| Referential Example No. | Metal salt |
|---|---|
| 13 | Magnesium acetate |
| 14 | Manganese acetate |
| 15 | Cadmium acetate |
| 16 | Cobalt acetate |
| 17 | Lead acetate |
| 18 | Zinc formate |
| 19 | Zinc benzoate |

EXAMPLES 1 to 9 and COMPARATIVE EXAMPLES 1 to 3

Referential Example 20 (Two-stage process)

Into a 3-liter separable flask were charged 442 g of a 6:4 mixture of m-cresol and p-cresol, 4.4 g of zinc acetate dihydrate, and 44.0 g of deionized water. While heating the reactants with stirring in an oil bath at 110° C., 299 g of formalin (37.0% aqueous solution) was added dropwise thereto over 40 minutes. The reaction was continued with heating and stirring for 40 minutes. Then, 410 g of ethyl cellosolve acetate and 83 g of a 5% aqueous solution of oxalic acid were successively charged. The reaction was further continued with heating and stirring in an oil bath at 110° C. for 8 hours. After neutralization, washing with water, and dehydration, there was obtained a novolak resin in the form of ethyl cellosolve acetate solution. The weight average molecular weight measured by the GPC chromatograph was 11730.

Referential Example 21

Into a 3-liter separable flask were charged 442 g of a 6:4 mixture of m-cresol and p-cresol, 299 g of formalin (37.0% aqueous solution), 6.8 g of oxalic acid dihydrate, 40 g of deionized water, and 400 g of ethyl cellosolve acetate. The reactants were heated with stirring in an oil bath at 110° C. for 4.5 hours. After neutralization, washing with water, and dehydration, there was obtained a novolak resin in the form of ethyl cellosolve acetate solution. The weight average molecular weight measured by the GPC chromatograph was 12500.

Photoresist solutions were prepared by dissolving the novolak resin obtained in each of Referential Examples 1 to 12, and a photosensitizer, an epoxy resin, and a dye in a 8:1:1 mixed solvent of ethyl cellosolve acetate/n-butyl acetate/xylene. (The quantity of solvent was so adjusted that a 1.25 μm thick film was obtained when the solution was applied under the following conditions.) The solution was filtered through a filter having a pore size of 0.2 μm for removal of foreign matters.

Using a spinner at 4000 rpm, the solution was applied to a silicone wafer which had been cleaned in the usual way. The coated wafer was baked in a clean oven at 90° C. for 20 minutes. The wafer was exposed to the light of a 350W super-high pressure mercury vapor lamp using a contact aligner. The exposure was made through a step tablet mask having the light transmittance which changes in regular steps from one end to the other. Development was performed for 75 seconds by using an aqueous solution (2.38%) of tetramethyl ammonium hydroxide. After rinsing and drying, the γ-value was obtained by plotting the rate of development in each step against the exposure energy. The results are shown in Table 1. It is to be noted that the γ-value in Examples 1 to 9 was greatly improved as compared with that in Comparative Examples 1 to 3.

TABLE 1

(Novolak Resin and Performance of Photoresist)

| | Novolak Resin | | | Other Components | | | Performance of resist | | |
|---|---|---|---|---|---|---|---|---|---|
| | Referential Example No. | Catalyst(s) | Mw | Quantity (parts) | Sensitizer (parts) | Epoxy resin[3] (parts) | Dye[4] (parts) | γ-value | Sensitivity[5] (sec) | Film thickness retention[6] |
| Example 1 | 1 | Zinc acetate | 4420 | 17 | A[1] | 7 | 2.0 | 0.15 | 2.0 | 3.9 | 95 |
| Example 2 | 2 | Zinc acetate/ Oxalic acid | 4460 | 17 | A | 7 | 2.0 | 0.15 | 1.7 | 2.2 | 98 |
| Example 3 | 3 | Zinc acetate/ Oxalic acid | 7280 | 17 | A | 7 | 1.0 | 0.15 | 1.6 | 2.6 | 96 |
| Example 4 | 4 | Zinc acetate/ Oxalic acid | 7430 | 17 | A | 7 | 0 | 0.15 | 1.7 | 2.2 | 94 |
| Example 5 | 5 | Zinc acetate/ Oxalic acid | 8010 | 17 | B[2] | 6 | 0.7 | 0 | 1.7 | 1.4 | 92 |
| Example 6 | 6 | Zinc acetate/ Oxalic acid | 10890 | 17 | B | 6 | 0 | 0.15 | 1.7 | 2.1 | 96 |
| Example 7 | 7 | Zinc acetate/ Oxalic acid | 13200 | 17 | B | 6 | 0 | 0.15 | 1.6 | 2.3 | 94 |
| Comparative | 8 | Oxalic acid | 8220 | 17 | A | 7 | 1.5 | 0.15 | 1.1 | 3.4 | 92 |

TABLE 1-continued (Novolak Resin and Performance of Photoresist)

| | Novolak Resin | | | Other Components | | | Performance of resist | | |
|---|---|---|---|---|---|---|---|---|---|
| | Referential Example No. | Catalyst(s) | Mw | Quantity (parts) | Sensitizer (parts) | Epoxy resin[3] (parts) | Dye[4] (parts) | γ-value | Sensitivity[5] (sec) | Film thickness retention[6] |

| | | | | | | | | | | |
|---|---|---|---|---|---|---|---|---|---|---|
| Example 1 | | | | | | | | | | |
| Example 8 | 9 | Zinc acetate/ Oxalic acid | 5010 | 17 | A | 7 | 0.8 | 0.15 | 1.7 | 3.2 | 93 |
| Comparative Example 2 | 10 | Oxalic acid | 5280 | 17 | A | 7 | 0.8 | 0.15 | 1.2 | 3.2 | 91 |
| Example 9 | 11 | Zinc acetate/ Oxalic acid | 4830 | 17 | A | 7 | 0.6 | 0.15 | 1.8 | 1.5 | 99 |
| Comparative Example 3 | 12 | Oxalic acid | 5570 | 17 | A | 7 | 1.5 | 0.15 | 1.2 | 1.6 | 92 |

Note to Table 1.
[1]Sensitizer A: Condensation reaction product of naphthoquinone-(1,2)-diazido-(2)-5-sulfonyl chloride and 2,3,4-trihydroxybenzophenone (in molar ratio of 1.2:1)
[2]Sensitizer B: Condensation reaction product of naphthoquinone-(1,2)-diazido-(2)-5-sulfonyl chloride and 2,3,4-trihydroxybenzophenone (in molar ratio of 1.1:1)
[3]Epoxy resin: "Sumiepoxy ESCN-220F", a product of Sumitomo Chemical Co., Ltd.
[4]Dye: Anthraquinone dye, "Sumiplast Red AS", a product of Sumitomo Chemical Co., Ltd.
[5]Sensitivity: Minimum exposure time required for completely removing the resist film in the exposed area under the development condition
[6]Film thickness retention: Percent of the film thickness in the unexposed area after development to that before development Next, the pattern size reproducibility was evaluated in the following manner.

The composition of Example 7 was applied to a silicone wafer and baked in a clean over in the same manner as used above. The wafer was then exposed to light through a mask having a line and space pattern of 1.5 μm using the same contact aligner. The exposure to light was performed with several spots on one wafer while varying the exposure time. Thereafter, development, rinsing, and drying were performed in the same manner as used above. The line and space pattern of 1.5 μm of the respective spots having varied exposure time was observed by a scanning-type electron microscope to measure the pattern size. (That is, after cutting the wafer, the cross-sectional shape of the resist was observed, and the length of the bottom portion of the resist pattern was measured as the pattern size.) For comparison, the composition of Comparative Example 1 was applied, exposed to light, and developed, and the pattern size of the resist was measured at each exposure time by a scanning-type electron microscope, in the same manner as used above. FIG. 4 shows the behaviour of the change in the pattern size against the varied exposure time with respect to the compositions of Example 7 and Comparative Example 1. It is to be noted from FIG. 4 that the sample of Example 7 had a very wide allowable range for reproducing the mask size as compared with that of Comparative Example 1, which means that the composition of the invention is very good in the pattern size reproducibility.

EXAMPLES 13 to 19

Photoresist solutions were prepared by dissolving 17 parts of the novolak resin obtained in each of Referential Examples 13 to 19, 7 parts of the same photosensitizer as used in Example 1, 2.0 parts of the same epoxy resin as used in Example 1, and 0.15 part of the same dye as used in Example 1, in a 7:3 mixed solvent of ethyl cellosolve acetate/n-butyl acetate. (The quantity of solvent was so adjusted that a 1.25 μm thick film was obtained when the solution was applied by means of a spinner at 4000 rpm.) Filtration, application to silicone wafers, baking, exposure, development, rinsing, and drying were carried out in the same way as in Example 1. The γ-value was obtained by plotting the rate of development in each step against the exposure energy. The results are shown in Table 2. It is to be noted that the γ-value was greatly improved in Examples 13 to 19.

TABLE 2

(Novolak Resin and Performance of Photoresist)

| Example No. | Novolak resin | γ-Value |
|---|---|---|
| 13 | Referential Example 13 | 2.0 |
| 14 | Referential Example 14 | 2.2 |
| 15 | Referential Example 15 | 2.0 |
| 16 | Referential Example 16 | 1.9 |
| 17 | Referential Example 17 | 1.8 |
| 18 | Referential Example 18 | 2.0 |
| 19 | Referential Example 19 | 1.9 |

EXAMPLES 20 AND 21 AND COMPARATIVE EXAMPLE 4

The novolak resin, sensitizer, epoxy resin, and dye shown in Table 3 (attached hereto) were dissolved in an 8:1:1 mixed solvent of ethyl cellosolve acetate/n-butyl acetate/xylene. (The quantity of solvent was adjusted to be 1.25 μm thick film by rotary coating using a spinner.) The obtained resist solution was filtered, applied, baked, exposed to light through a step tablet mask, developed, rinsed, and dried in the same manner as used in Example 1. The γ-value was obtained by plotting the rate of development in each step against the exposure energy. The results are shown in Table 3. It is to be noted from Table 3 that the γ-value in Examples 20 and 21 was greatly improved as compared with that in Comparative Example 4.

Further, these samples were evaluated in terms of pattern size reproducibility in the same manner as used in Example 7. The results are shown in FIGS. 5 and 6. It is to be noted from FIGS. 5 and 6 that the samples of Examples 20 and 21 had a very wide allowable range for reproducing the mask size as compared with that of Comparative Example 4, which means that the samples of the invention are very good in the pattern size reproducibility.

While the invention has been described in detail and with reference to specific embodiment thereof, it will be apparent to one skilled in the art that various changes and modifications can be made therein without departing from the spirit and scope thereof.

Another important item of performance is pattern size reproducibility. The term "pattern size reproducibility" referred to herein means a rate of transfer of the pattern size of the mask to that of the resist. The rate of transfer in pattern size is influenced by and varied with changes in the process condition, such as reflectance of a substrate to be applied, coating thickness of the resist, prebaking temperature, exposure time, and development condition. In general, in the production of integrated circuits such as IC and LSI, these conditions are controlled within a certain range such that it is managed to stably reproduce the pattern size of the resist and obtain devices in stable yield. However, when the pattern size reaches a level of 1 μm, even a slight variation of the process condition greatly influences the pattern size of the resist to make the control difficult. Thus it is demanded to realize a resist having more stable pattern size reproducibility against the changes in the process condition.

TABLE 3

(Novolak Resin and γ-Value)

| | Novolak Resin | | | Other Components | | | |
| --- | --- | --- | --- | --- | --- | --- | --- |
| | | | | Sensi- | Epoxy | | |
| | Referential | | Quantity | tizer | resin* | Dye** | |
| | Example No. | Catalyst(s) | Mw | (parts) | (parts) | (parts) | (parts) | γ-Value |
| Example 20 | 1 | Zinc acetate | 4420 | 17 | C(7) 5 | 1.0 | 0.15 | 2.0 |
| Example 21 | 20 | Zinc acetate/Oxalic acid | 11730 | 17 | C 5 | 0.4 | 0.05 | 1.7 |
| Comparative Example 4 | 21 | Oxalic acid | 12500 | 17 | C 5 | 0.2 | 0.25 | 1.2 |

(7)Reaction product of naphthoquinone-(1,2)-diazido-(2)-5-sulfonyl chloride and 2,3,4-trihydroxybenzophenone
*The same as the epoxy resin used in Example 1
**The same as the dye used in Example 1

What is claimed is:

1. A positive type photoresist composition comprising a mixture of a novolak resin and a photo-sensitive o-quinonediazide compound, wherein said novolak resin is one which is obtained by the addition condensation reaction of a phenol and formaldehyde which is performed at pH 4 to 7 by using as a catalyst an organic acid salt of a divalent metal which is more electropositive than hydrogen, said phenol being at least one compound represented by the formula:

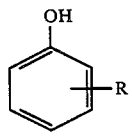

wherein R is hydrogen, a methyl group of an ethyl group, said compound being such that the average carbon number in the substituent per one nucleus is 0.5 to 1.5 and the ones with the substituent at the ortho- or para-position with respect to the hydroxyl group account for less than 50 mol %, and said o-quinonediazide compound and said novolak resin being present in a weight ratio of 1:1 to 1:6, said composition in a photoresist use providing a gamma-value of above about 1.6.

2. A positive type photoresist composition comprising a mixture of a novolak resin and a photo-sensitive o-quinonediazide compound, wherein said novolak resin is one which is obtained by the partial addition condensation reaction of a phenol and formaldehyde which is performed at pH 4 to 7 by using as a catalyst an organic acid salt of a divalent metal which is more electropositive than hydrogen, and by the subsequent addition condensation reaction which is performed at pH 4 or below by using an acid catalyst, said phenol being at least one compound represented by the formula:

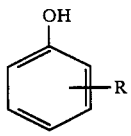

wherein R is hydrogen, a methyl group of an ethyl group, said compound being such that the average carbon number in the substituent per one phenol nucleus is 0.5 to 1.5 and the ones with the substituent at the ortho- or para-position with respect to the hydroxyl group account for less than 50 mol %, and said o-quinonediazide compound and said novolak resin being present in a weight ratio of 1:1 to 1:6, said composition in a photoresist use providing a gamma-value of above about 1.6.

3. A positive type photoresist composition as recited in claim 1, wherein the phenol is a phenol containing more than 95 mol % of m-cresol.

4. A positive type photoresist composition as recited in claim 2, wherein the phenol is a phenol containing more than 95 mol % of m-cresol.

5. A positive type photoresist composition as recited in claim 1, wherein the divalent metal which is more electropositive than hydrogen is selected from the group consisting of Zn, Mn, Cd, Co, Mg, Pb, Ba, Ca, and Sr.

6. A positive type photoresist composition as recited in claim 1, wherein the divalent metal which is more electropositive than hydrogen is selected from the group consisting of Zn, Mn, Cd, Co, Mg, and Pb.

7. A positive type photoresist composition as recited in claim 2, wherein the divalent metal which is more electropositive than hydrogen is selected from the group consisting of Zn, Mn, Cd, Co, Mg, Pb, Ba, Ca, and Sr.

8. A positive type photoresist composition as recited in claim 2, wherein the divalent metal which is more electropositive than hydrogen is selected from the group consisting of Zn, Mn, Cd, Co, Mg, and Pb.

9. A positive type photoresist composition as recited in claim 1, wherein the organic acid salt of a divalent metal which is more electropositive than hydrogen is an organic acid salt of zinc.

10. A positive type photoresist composition as recited in claim 2, wherein the organic acid salt of a divalent metal which is more electropositive than hydrogen is an organic acid salt of zinc.

11. A positive type photoresist composition as recited in claim 1, wherein the organic acid salt is an acetate, a formate, a lactate, or a benzoate.

12. A positive type photoresist composition as recited in claim 1, wherein the organic acid salt is an acetate.

13. A positive type photoresist composition as recited in claim 2, wherein the organic acid salt is an acetate, a formate, a lactate, or a benzoate.

14. A positive type photoresist composition as recited in claim 2, wherein the organic acid salt is an acetate.

15. A positive type photoresist composition comprising a mixture of a novolak resin and a photo-sensitive o-quinonediazide compound in a weight ratio of from 1:1 to 6:1 and additionally a solvent, an epoxy resin, a plasticizer and a dye, wherein said novolak resin is one which is obtained by the addition condensation reaction of a phenol and formaldehyde which is performed at pH 4 to 7 by using as a catalyst an organic acid salt of a divalent metal which is more electropositive than hydrogen, said phenol being at least one compound represented by the formula:

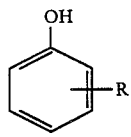

wherein R is hydrogen, a methyl group or an ethyl group, said compound being such that the average carbon number in the substituent per one phenol nucleus is 0.5 to 1.5 and the ones with the substituent at the ortho- or para-position with respect to the hydroxyl group account for less than 50 mol %, said composition in a photoresist use providing a gamma-value of above about 1.6.

16. A positive type photoresist composition comprising a mixture of a novolak resin and a photo-sensitive o-quinonediazide compound in a weight ratio of from 1:1 to 6:1 and additionally a solvent, an epoxy resin, a plasticizer and a dye, wherein said novolak resin is one which is obtained by the partial addition condensation reaction of a phenol and formaldehyde which is performed at pH 4 to 7 by using as a catalyst an organic acid salt of a divalent metal which is more electropositive than hydrogen, and by the subsequent addition condensation reaction which is performed at pH 4 or below by using an acid catalyst; said phenol being at least one compound represented by the formula:

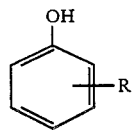

wherein R is hydrogen, a methyl group or an ethyl group, said compound being such that the average carbon number in the substituent per one phenol nucleus is 0.5 to 1.5 and the ones with the substituent at the ortho- or para-position with respect to the hydroxyl group account for less than 50 mol %, said composition in a photoresist use providing a gamma-value of above about 1.6.

17. A positive type photoresist composition as recited in claim 15, wherein the photosensitive o-quinonediazide compound is one obtained by condensing naphthoquinonediazidosulfonyl chloride or benzoquinonediazidosulfonyl chloride with a compound having hydroxyl groups in the presence of a weak alkali.

18. A positive type photoresist composition as recited in claim 16, wherein the photosensitive quinonediazide compound is one obtained by condensing naphthoquinonediazidosulfonyl chloride or benzoquinonediazidosulfonyl chloride with a compound having hydroxyl groups in the presence of a weak alkali.

19. A positive type photoresist compoistion as recited in claim 15, wherein the epoxy resin is added in an amount of 1 to 20 wt % based on the total weight of the novolak resin and quinonediazide compound.

20. A positive type photoresist composition as recited in claim 16, wherein the epoxy resin is added in an amount of 1 to 20 wt % based on the total weight of the novolak resin and quinonediazide compound.

21. A positive type photoresist composition as recited in claim 15, wherein the solvent is ethyl cellosolve acetate, methyl cellosolve acetate, ethyl cellosolve, methyl cellosolve, butyl acetate, methyl isobutyl ketone, or xylene.

22. A positive type photoresist composition as recited in claim 16, wherein the solvent is ethyl cellosolve acetate, methyl cellosolve acetate, ethyl cellosolve, methyl cellosolve, butyl acetate, methyl isobutyl ketone, or xylene.

* * * * *